United States Patent [19]

Burt

[11] Patent Number: 4,737,839

[45] Date of Patent: Apr. 12, 1988

[54] SEMICONDUCTOR CHIP MOUNTING SYSTEM

[75] Inventor: Roy J. Burt, Sunnyvale, Calif.

[73] Assignee: Trilogy Computer Development Partners, Ltd., Cupertino, Calif.

[21] Appl. No.: 838,636

[22] Filed: Mar. 11, 1986

Related U.S. Application Data

[62] Division of Ser. No. 590,652, Mar. 19, 1984, Pat. No. 4,574,470.

[51] Int. Cl.⁴ .................. H01L 23/54; H01L 23/10; H01L 23/12
[52] U.S. Cl. .................................. 357/67; 357/71; 357/74; 357/81; 357/82
[58] Field of Search ................. 357/71, 82, 68, 74, 357/81

[56] References Cited

U.S. PATENT DOCUMENTS

| | | | |
|---|---|---|---|
| 3,633,076 | 1/1972 | Arndt | 357/67 |
| 3,706,015 | 12/1972 | Schimmer et al. | 357/67 |
| 3,746,944 | 7/1973 | Naroaka et al. | 357/67 |
| 4,176,443 | 12/1979 | Iannzzi et al. | 357/67 |
| 4,480,261 | 10/1984 | Hattori et al. | 307/67 |

OTHER PUBLICATIONS

"Silicides for Interconnection Technology"-Solid State Technology-Author-Farrokh Mohammed-Jan.-1981, pp. 65-72.

Primary Examiner—Andrew J. James
Assistant Examiner—S. V. Clark
Attorney, Agent, or Firm—Townsend & Townsend

[57] ABSTRACT

A semiconductor chip module with a flat mounting surface is disclosed. A wafer-scale silicon semiconductor chip is provided with electronic circuits formed therein. The chip has a metallized back face and contacts on the opposite, front face. A solder layer secures the metallized back face of the chip to the mounting surface substantially without voids.

19 Claims, 9 Drawing Sheets

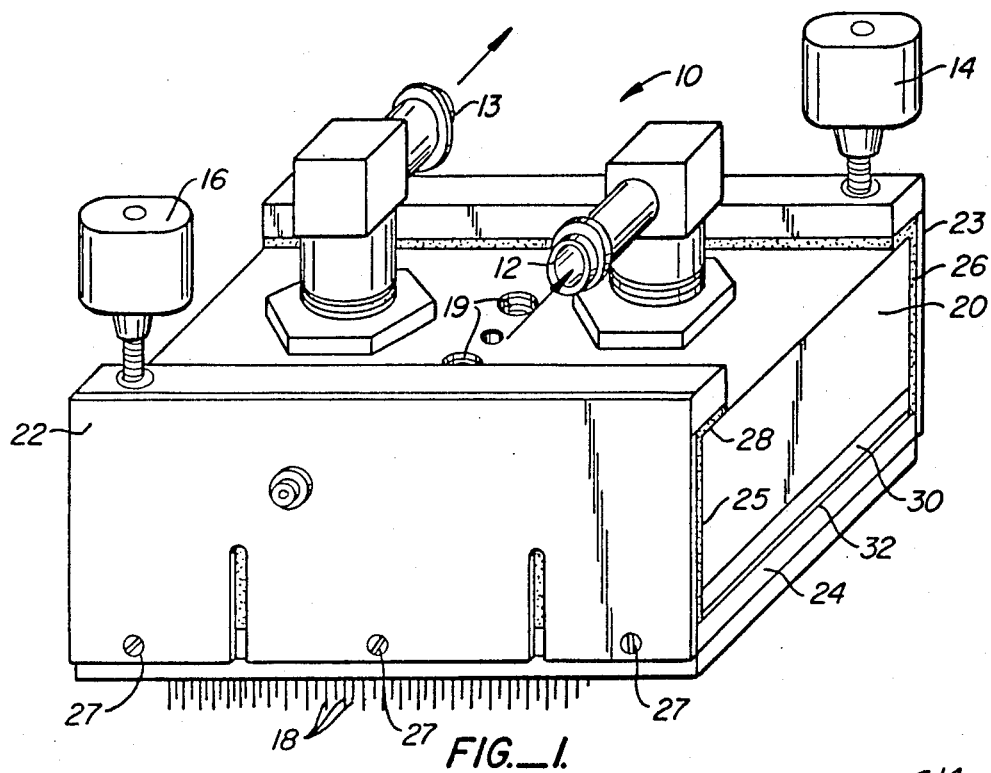
FIG._1.
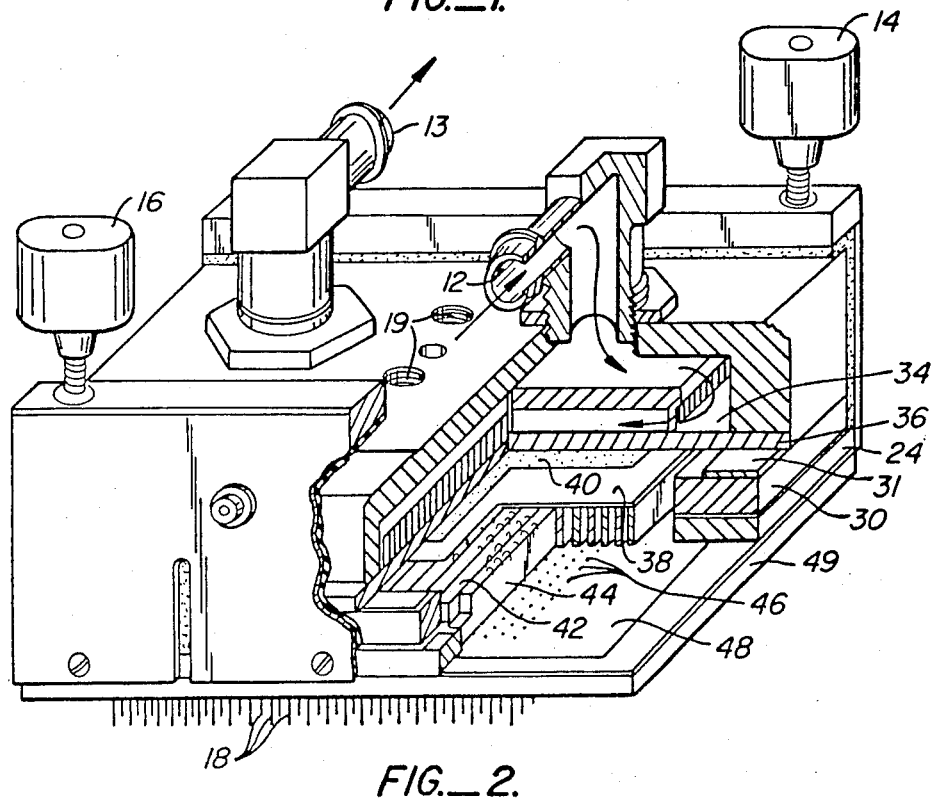
FIG._2.

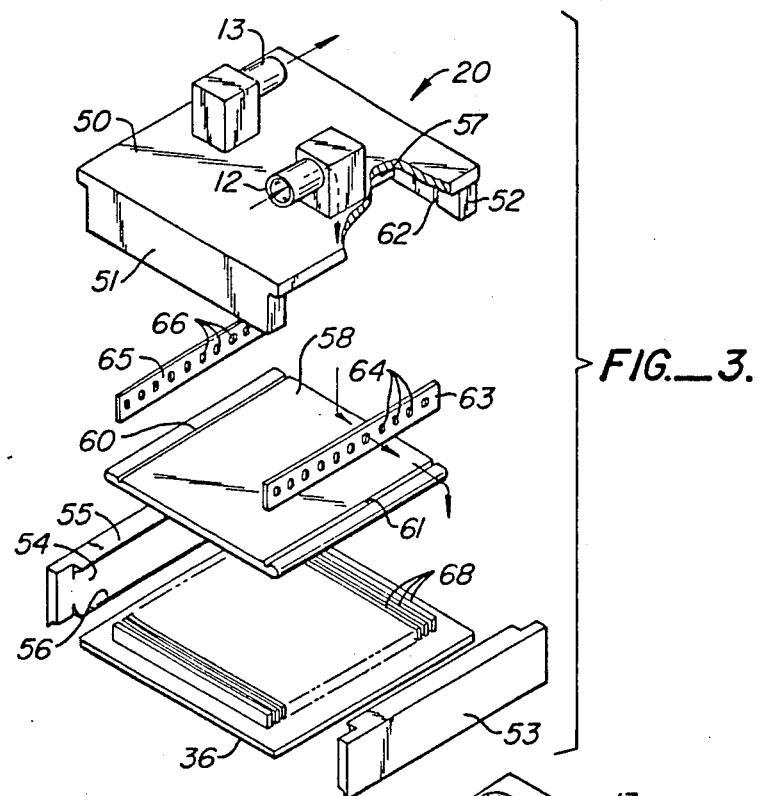
FIG._3.
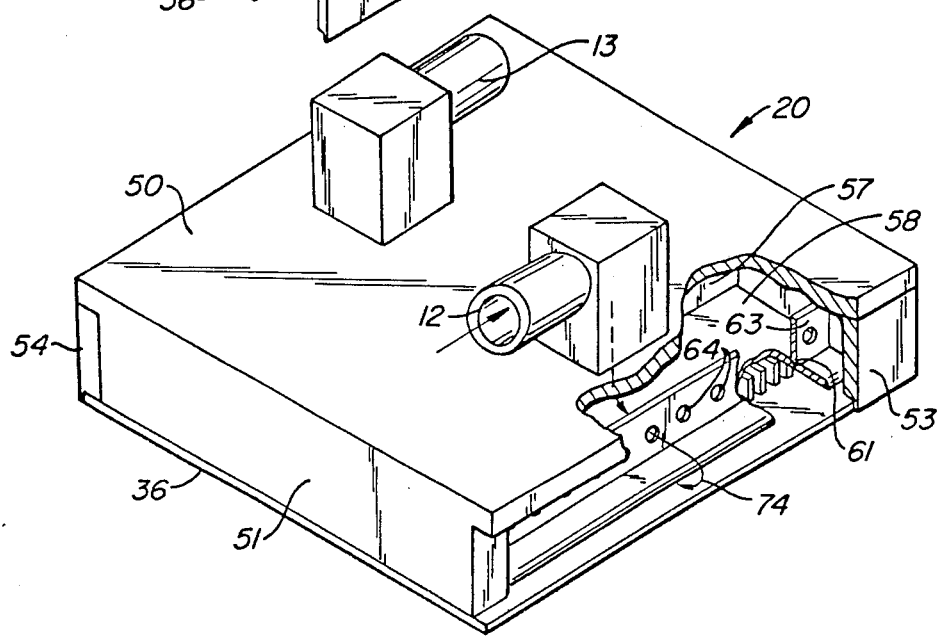
FIG._4.

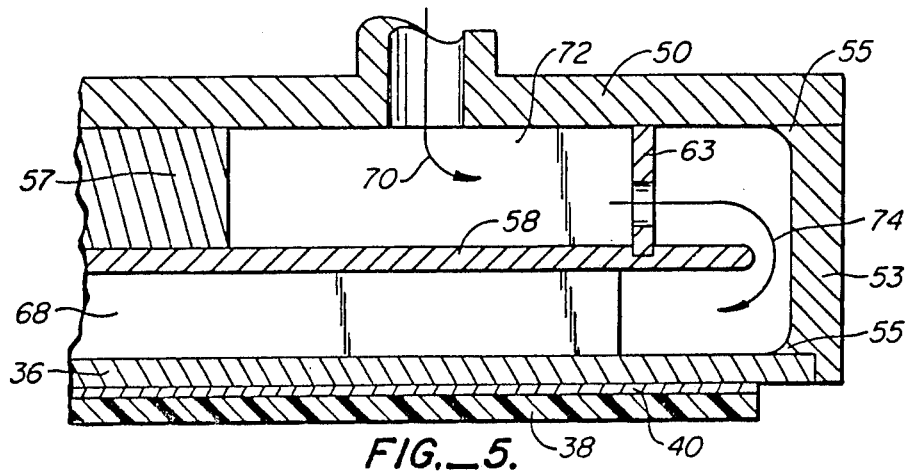
FIG._5.
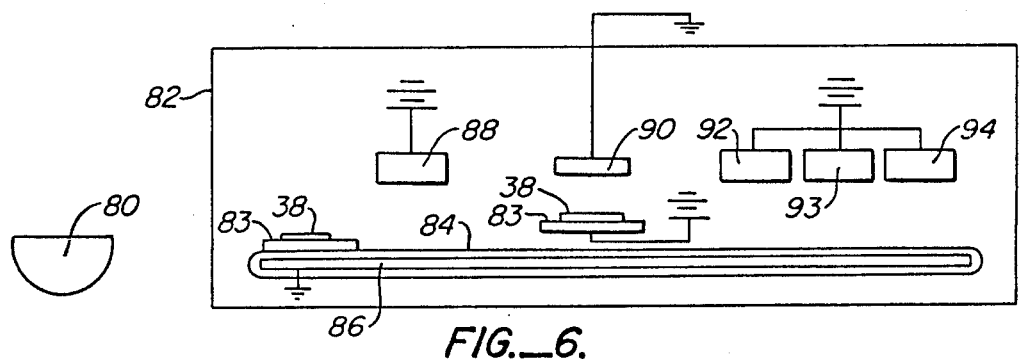
FIG._6.
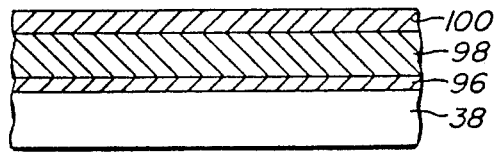
FIG._7A.
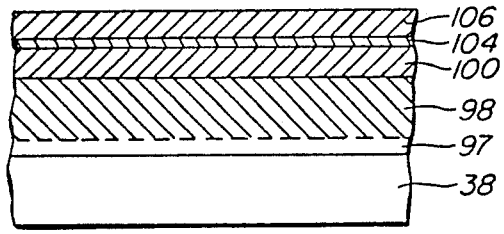
FIG._7B.
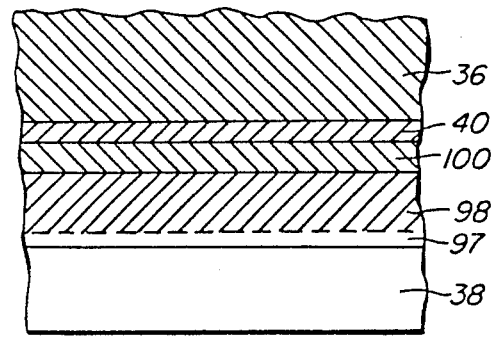
FIG._7C.

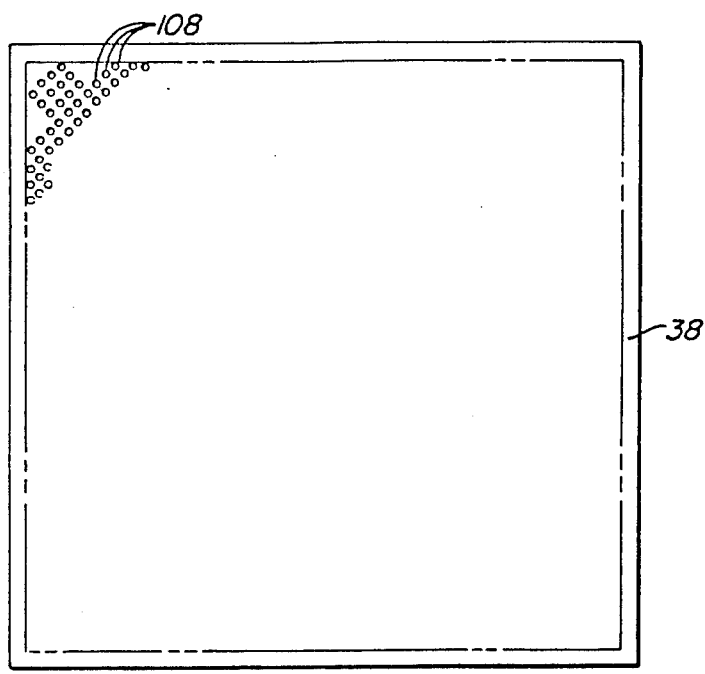
FIG._8A.
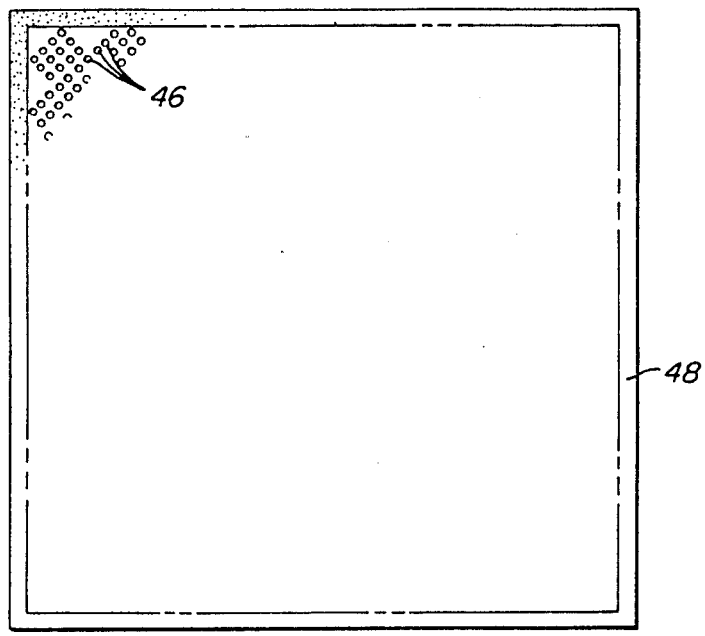
FIG._8B.

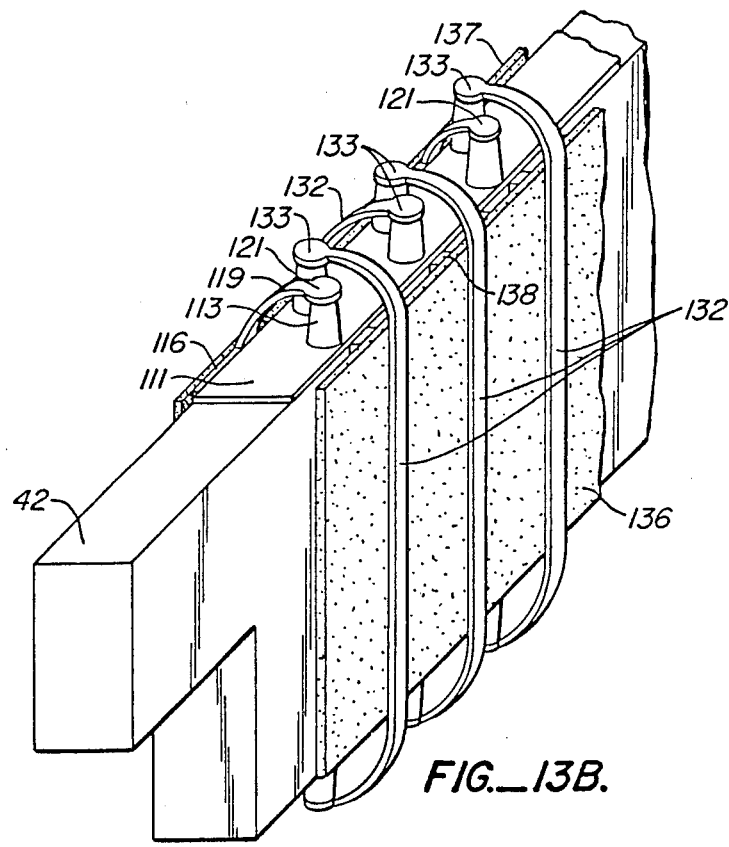
FIG._13B.
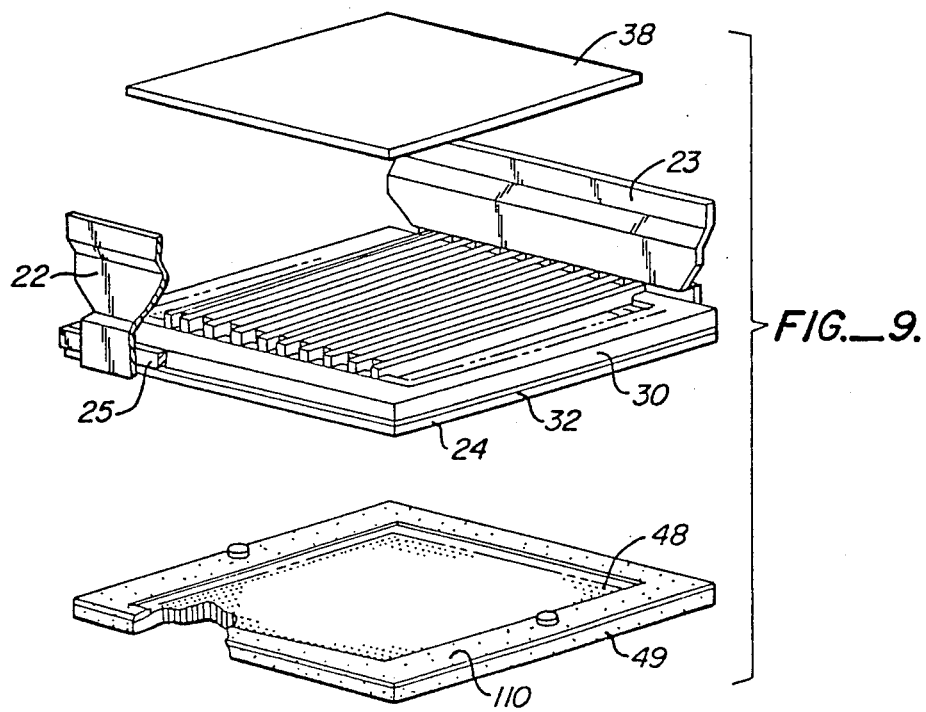
FIG._9.

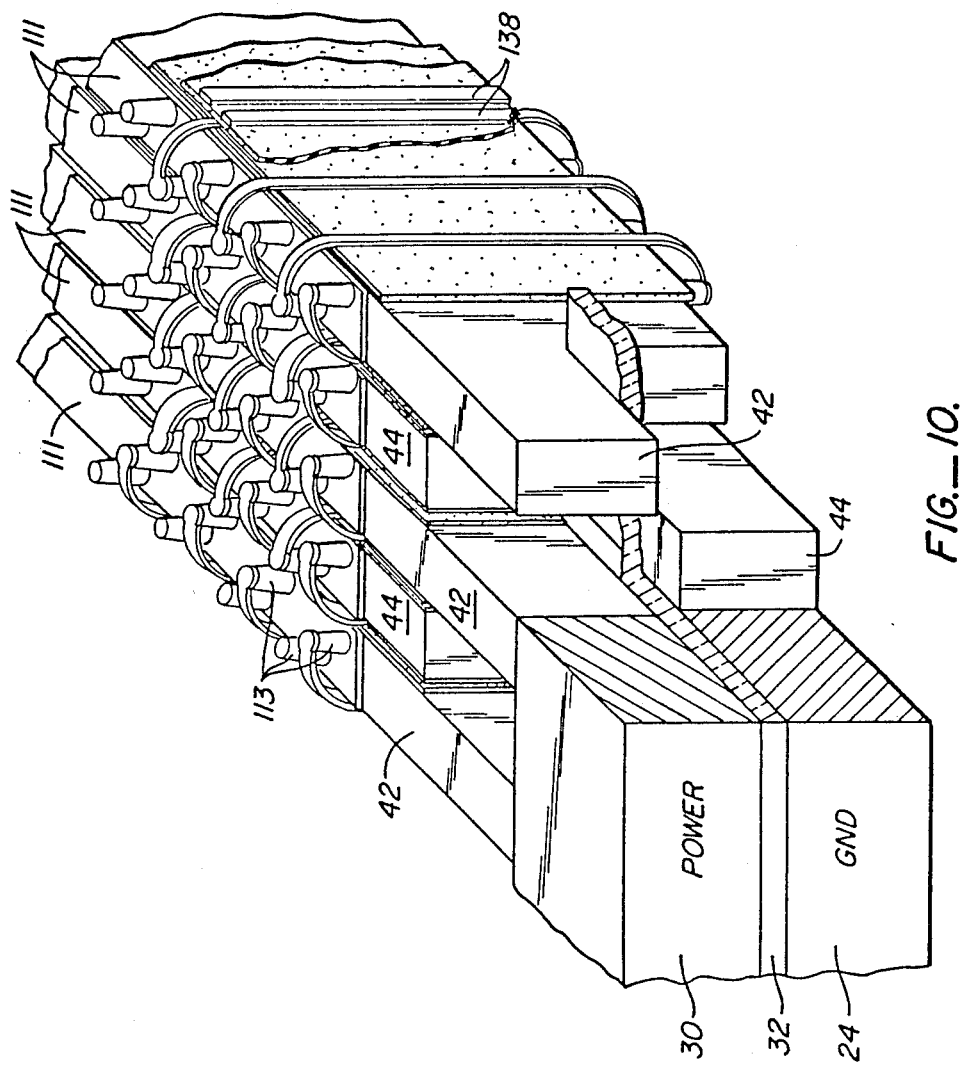
FIG._10.

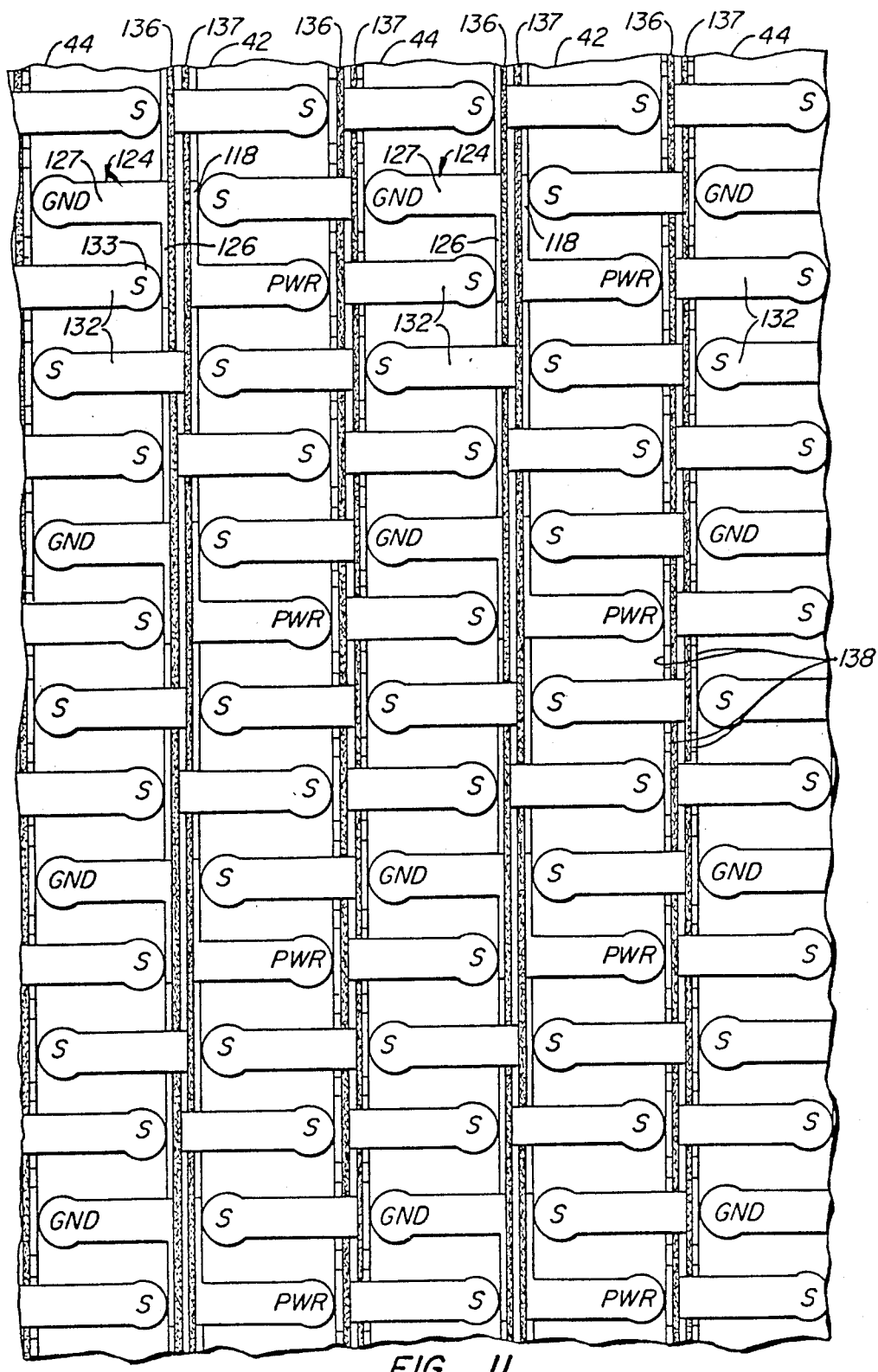
FIG._11.

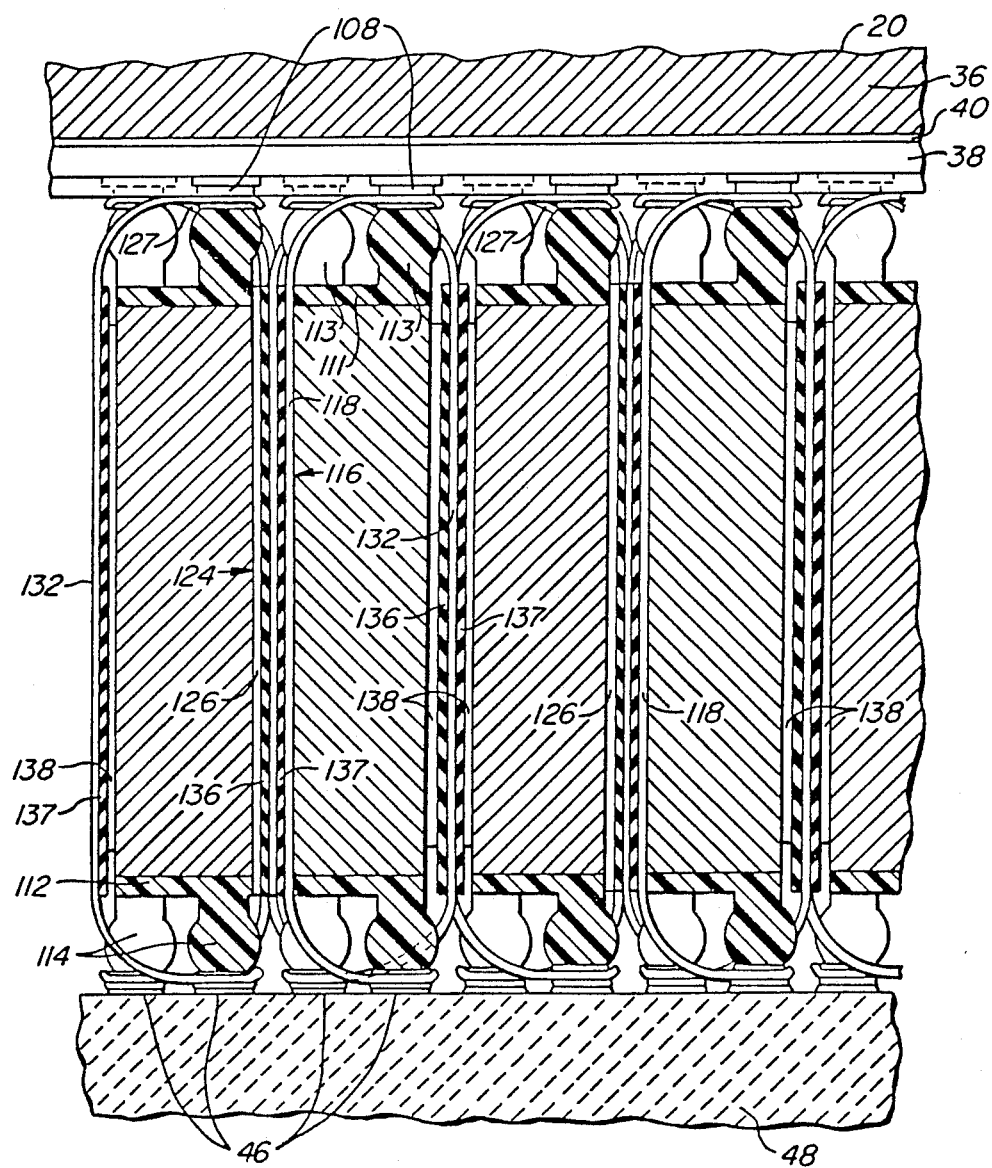
FIG._12.

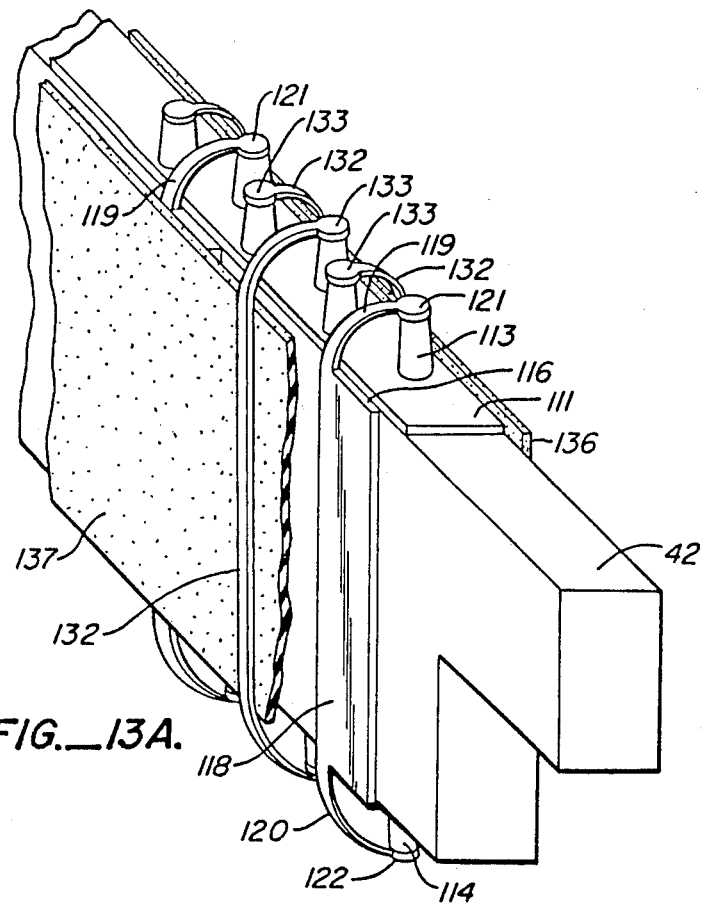
FIG._13A.
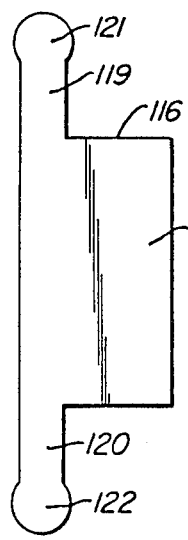
FIG._14A.
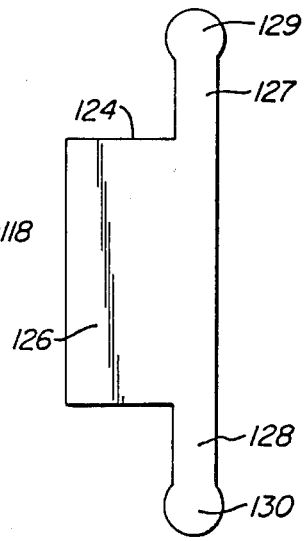
FIG._14B.
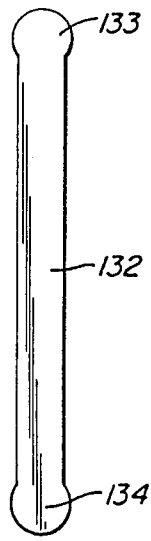
FIG._14C.

SEMICONDUCTOR CHIP MOUNTING SYSTEM

This is a division of application Ser. No. 590,652 filed Mar. 19, 1984 now U.S. Pat. No. 4,574,470.

BACKGROUND OF THE INVENTION

1. Field of the Invention

The present invention relates to a system for mounting a relatively large semiconductor chip to a support such as a heat sink.

2. Description of the Prior Art

Semiconductor die or "chips" are normally formed in multiples in a silicon wafer which is about 5 inches in diameter. The wafer is then cut into individual chips, usually no larger than about 50 square millimeters, each of which contains a large number of electronic circuit elements. Logic chips which perform arithmetic computation functions, for example the function of addition, are now in production which have more than 40,000 transistors and other circuit elements in a 50 square millimeter area.

Even with the large number of functions which can be accommodated on a single chip, a large number of such chips are required in computing systems with significant capacity. Overall system speed is limited by the necessity of transmitting signals between logic circuits on different chips, and it would be desirable to increase the size of the individual chips to reduce the number of chip-to-chip communications, and thus increase system speed. Large size chips have not been effectively implemented for a variety of reasons, among which is the difficulty in adequately mounting such a chip to a supporting structure. Such difficulties are multiplied when the size of the chips is increased to "wafer-scale" having dimensions on the order of 60×60 millimeters.

Semiconductor chips are typically mounted to a supporting structure by solder. Before soldering, the chip is prepared by metallizing the back surface of the chip with a several thousand Angstrom layer of gold, or by a thin layer of chromium followed by the gold layer. The metallized chip is heat treated, and the gold layer partially reacts with the silicon to form a gold/silicon eutectic. Upon soldering, the gold and chromium layers are leached (dissolved) into the solder, and the solder attaches directly to the silicon chip through the gold-/silicon eutectic.

Soldering of the chip to the support in the conventional fashion results in voids in the solder which contain trapped ambient gas from the soldering environment, usually air. The chip is typically moved back and forth while the solder is molten to reduce such voids, and mechanical brushing techniques have also been tried to distribute the solder and eliminate the trapped gas. However, even when great care is taken to make the soldering attachment of a 50 square millimeter chip, about 20% or more of the volume between the chip and the support typically constitute gas-filled voids in the solder.

Conventional solder attachment techniques are insufficient to properly mount a wafer scale chip. A wafer scale chip requires positive cooling, such as by mounting the chip directly to a heat sink, because of the heat generated by the large number of circuits. The gas-filled voids in a conventional soldered connection to a heat sink result in "hot spots" because the gas in the voids is a thermal insulator. Such a hot spot in a critical position could destroy the chip. Furthermore, it is not possible as a practical matter to apply mechanical brushing techniques or movement techniques to chips having wafer scale dimensions because such chips must be extremely accurately positioned on the support. Also, conventional soldering techniques utilize a solder which melts and then refreezes at a temperature of about 370° C., and thermal mismatch between the support and the chip would be such during cooling from 370° C. to room temperature for a chip of wafer dimensions that the delicate semiconductor chip may be fractured.

SUMMARY OF THE INVENTION

The present invention provides a semiconductor chip module with a flat mounting surface. A wafer-scale silicon semiconductor chip is provided with electronic circuits formed therein. The chip has a metallized back face and contacts on the opposite, front face. A solder layer secures the metallized back face of the chip to the mounting surface substantially without voids.

In the preferred embodiment of the invention, the back surface of the chip is first metallized with gold, nickel-vanadium, and gold layers in series, and then heat treated. The heat treatment causes the nickel-vanadium to diffuse through both the gold layers, forming a nickel-rich silicide at the junction of the internal gold layer and the chip, and forming an alloy layer with the outer gold layer. The heat treatment is performed at a temperature sufficient to also cause a gold/silicon diffusion with the inner gold layer, but preferably below that at which a gold/silicon eutectic would be formed. After heat treatment, additional layers of nickel-vanadium and gold are added, the outermost gold layer providing a wetable surface. When the solder is applied, the outer gold and nickel-vanadium layers are leached into the solder, which attaches primarily to the alloy layer. A low temperature solder, typically indium/lead, is used, which is soft to accommodate some degree of thermal mismatch, and which greatly reduces the amount of thermal expansion mismatch because of the reduced differential between the freezing point of the solder (about 170° C.) and ambient.

With the module of the present invention, the flat mounting surface can be used as the heat sink, with heat dissipation taking place through the solder attachment. The solder attachment is made substantially without gas-filled voids, preventing hot spots where the chip would otherwise be overheated and perhaps destroyed.

The novel features which are characteristic of the invention, as to organization and method of operation, together with further objects and advantages thereof will be better understood from the following description considered in connection with the accompanying drawings in which a preferred embodiment of the invention is illustrated by way of example. It is to be expressly understood, however, that the drawings are for the purpose of illustration and description only and are not intended as a definition of the limits of the invention.

BRIEF DESCRIPTION OF THE DRAWINGS

FIG. 1 is a perspective view of the preferred embodiment of the module of the present invention;

FIG. 2 is a perspective view of the preferred embodiment of the present invention with portions broken away;

FIG. 3 is an exploded view of the heat sink portion of the preferred embodiment of the present invention;

FIG. 4 is a perspective view of the heat sink portion of the preferred embodiment with portions broken away;

FIG. 5 is a fragmentary plan view of the heat sink portion of the preferred embodiment with the chip attached;

FIG. 6 is a schematic view of the metallizing process used in constructing the preferred embodiment;

FIGS. 7A–C is a sequence of fragmentary plan views illustrating the various steps in preparing the semiconductor chip and attaching it to the heat sink of the preferred embodiment;

FIGS. 8A and B are bottom and top plan views of the chip and multilayer ceramic respectively of the preferred embodiment;

FIG. 9 is an exploded view of the chip, bus bar assembly and multilayer ceramic of the preferred embodiment;

FIG. 10 is a fragmentary perspective view of the bus bars and bus bar frames of the preferred embodiment;

FIG. 11 is a fragmentary plan view of the bus bars and leads of the preferred embodiment;

FIG. 12 is a fragmentary elevation view of the bus bars and leads of the preferred embodiment;

FIGS. 13A and B are perspective views of a single power bus bar from the power and signal sides respectively;

FIGS. 14A–C are elevation views of the power, ground and signal leads of the preferred embodiment before incorporation in the module.

DESCRIPTION OF THE PREFERRED EMBODIMENT

1. General Description

The preferred embodiment 10 of the present invention is illustrated generally by way of reference to FIGS. 1 and 2 in combination. The unit includes a water inlet 12 and a water outlet 13 for liquid cooling of the module. Terminals 14 and 16 are provided for connection to an electrical ground. A plurality of pins 18 emanate from the base of the module, through which signal paths are established to a printed circuit board or other medium and in turn to other elements in the system. A pair of threaded holes 19 are provided for electrical connection to a power source, which also provides a supporting frame to physically mount the module. Other than water connections 12 and 13, ground terminals 14 and 16, pins 18, and power connection 19, the module is essentially self-contained.

A heat sink 20 forms the upper portion of the module. Ground terminals 14 and 16 are directly connected to conducting plates 22, 23 which are electrically insulated from heat sink 20 by sheets 25, 26 of insulative material. Plates 22, 23 are attached directly to a ground bus bar frame 24 by screws 26. A layer 32 of electrically insulating glass material is disposed between ground bus bar frame 24 and power bus bar frame 30. Power, typically at −5 volts is transmitted through heat sink 20 and frame 31 to power bus bar frame 30, which is directly coupled to the heat sink.

Internal to heat sink 20 is a fluid cavity 34 through which the cooling water flows, as best illustrated by FIG. 2. The lower portion of cavity 34 is defined by a plate 36. Directly attached to the lower surface of plate 36 is the semiconductor chip 38 by means of a solder or thermally conductive (e.g., silver loaded) epoxy layer 40. In the preferred embodiment illustrated a single large chip is used, but it is contemplated that the use of several chips in a single module may be desirable in certain applications, all of which would be directly attached to plate 36.

The electrical contacts for chip 38 are formed on the exposed surface of the chip, i.e., the surface away from the attachment surface to plate 36. The exposed surface of chip 38 is the lower surface as the module is depicted in FIG. 2. These contacts include power contacts, ground contacts, and signal contacts in an array, as will be discussed in more detail hereinafter. A plurality of interleaved power bus bars 42 and ground bus bars 44, supported respectively by power bus bar frame 30 and ground bus bar frame 24, traverse the module immediately beneath the exposed face of chip 38. Power and ground connections between the contacts on chip 38 and bus bars 42 and 44 are made by thin flat leads from the bus bars to the chip contacts, as will be discussed hereinafter. The signal contacts on the exposed face of chip 38 are connected to corresponding contacts 46 on a connector board, preferably a multilayer ceramic 48, as shown, by thin flat leads passing between the bus bars, as will also be described hereinafter. Electrical connections are provided through multilayer ceramic 48 from the various signal contacts 46 by internal tracer terminating in pins 18 for the transmission of signals to and from the chip.

2. Heat Sink

The construction of heat sink 20 is illustrated in more detail by way of reference to FIGS. 3–5. Heat sink 20 includes an upper plate 50 to which the water inlet 12 and water outlet 13 are attached. Other cooling fluids such as Freon, liquid helium or air could be used as appropriate. A pair of side walls 51, 52 form a part of upper plate 50. Other side walls 53, 54 and bottom plate 36 form a fully enclosed structure, and define in part interior cavity 34. End walls 53, 54 have curved ridges such as 55, 56 to form a curved contour at these end walls.

A center plate 58 is located within heat sink 20, and is flush with side walls 51, 52. However, a gap exists between the edges of center plate 58 and end walls 53, 54, leaving a space for the passage of the water. A bulkhead 57 is located between center plate 58 and upper plate 50, inlet 12 and outlet 13 being located on opposite sides of the bulkhead.

Grooves 60, 61 are formed in center plate 58, and corresponding grooves 62 are located in side walls 51, 52. An inlet distributor, comprising a plate 63 with a plurality of holes 64, is located within groove 61 and corresponding grooves 62. A similar outlet distributor, including plate 65 with holes 66, is located in groove 60 and in associated grooves in the side walls. Inlet distributor 63 and outlet distributor 65 completely block the passage between center plate 58 and the top of heat sink 20 so that all fluid must pass through the holes in the distributors.

A plurality of fins 68 are fixed to lower plate 36. Fins 68 are constructed between the end walls 53, 54, and span the space between bottom plate 36 and center plate 58 so that any fluid flowing between end walls 53 and 54 must pass between fins 68.

All of the elements of the preferred embodiment of heat sink 20, and frame 31, are preferably formed of molybdenum. Where fluid contact occurs, the molybdenum is nickel plated. While molybdenum is not an optimum heat conductor, nor is it an optimum electrical conductor, it is adequate in each regard, and has the overriding advantage of having thermal expansion characteristics closely matching those of the semiconductor chip. If differential expansion problems are overcome, better thermal conductors, such as copper, could be used.

Water entering heat sink 20 through inlet 12 is forced outwardly toward end wall 53 by the presence of central bulkhead 57, as illustrated by arrow 70. The volume bounded by upper plate 50, center plate 58, bulkhead 57 and inlet distributor 63 is designated as the inlet plenum 72. The flow restrictions imposed by the holes 64 in distributor 63 increase the pressure in the fluid and distribute the pressure evenly so that the fluid flow through each distributor hole 64 will be approximately equal. Moreover, when the water has passed through the distributor, it must make a 180° turn about the end of center plate 58, assisted by curved ridges 55, as illustrated by arrow 74. This turn also causes a pressure increase in the fluid, assuring equal pressure distribution along the length of end wall 53.

Fins 68 are located on a plane different from that of plenum 72. After the fluid exits the plenum, and makes the 180° turn about the end of center plate 58, it enters the fins. Because of the equalized pressure distribution resulting from the construction of plenum 72 and the 180° turn at the end of center plate 58, fluid flow between each fin 68 will be substantially equal. Moreover, it is contemplated that the flow rates will be limited and that the construction of fin 68 will be such that the flow between the fins is laminar. While laminar flow is less efficient in cooling fin 68 than turbulent flow, the required flow velocity and pressure input is much less, simplifying other design constraints in the system.

After the water leaves fin 68, it makes a similar 180° turn about the other edge of center plate 58, and passes through outlet distributor 65 into an outlet plenum similar to the inlet plenum. This construction, again, assures equalized pressure distribution so that the rate of fluid flow, and its cooling effect, is equal between the respective fins. The construction is also symmetric, so that the flow path can be reversed.

3. Chip Attachment to Heat Sink

In the preferred embodiment 10 of the module of the present invention, single large semiconductor chip 38 is attached to the underside of the lower plate 36 of heat sink 20 by a layer of solder 40, as illustrated in FIG. 5. Other thermally conductive bonding agents, such as silver-loaded epoxy, could also be used. In the preferred embodiment silicon chip 38 is much larger than conventional chips of this type, being on the order of 60 by 60 millimeters. Other smaller chips may be employed if desired. The manner in which the chip is prepared for soldering to heat sink 20 is illustrated by way of reference to FIGS. 6 and 7A-C.

The chip 38 is prepared for soldering by initially etching the backside of the chip in buffered oxide etch (6:1 BOE) bath 80 of ammonium fluoride and hydrofluoric acid, followed by a de-ionized water rinse and dry. Chip 38 is then placed face down on a pallet 83 on conveyor 84 which is grounded at 86 in an inline cathode planar magnetron vacuum sputtering chamber 82. The chip first moves under a substrate heater head 88 to degas the chip and pallet, while maintaining a high vacuum of less than $1 \times 10^{-6}$ Torr. The chip then moves to a grounded radio frequency sputter etch module 90, where chip 38 on pallet 83 is raised from grounded conveyor 84 and RF biased to 1000 V in a low pressure argon gas. About 300 Angstrom of backside silicon and silicon-oxide are etched away, leaving a clean oxide-free silicon backside.

The chip is then passed under metal cathodes 92, 93 which deposit a 1,500 Angstrom layer of gold and a 1,000 Angstrom layer of nickel—7 wt. % vanadium in sequence. The conveyor 84 is then reversed and chip 38 passed back underneath sputtering cathodes 93 and 92, which deposit a 5000 Angstrom layer of nickel—7 wt. % vanadium and a 3,000 Angstrom layer of gold in series. At the end of this process, the backside of chip 38 has the configuration shown in FIG. 7A, with a 1,500 Angstrom layer 96 of gold, a 6,000 Angstrom layer 98 of nickel—7 wt. % vanadium, and a 3,000 Angstrom layer 100 of gold.

The chip is then heat-treated in a nitrogen ambient furnace at 325° C. for 2 hours followed by 350° C. for one hour (these heat treatments may occur as part of subsequent wafer processing). During these heat treatments, the original three-layer system on chip 38, layer 96, 98 and 100, undergoes diffusion and intermetallic reactions that provide a low electrical contact resistance to lightly doped p-type (resistivity less than 20 $\Omega$-cm) semiconductor silicon, while also assuring a diffusion bond to the backside silicon. The nickel-vanadium layer 98 diffuses through the 1,500 Angstrom gold layer 96 to react with the silicon, forming a nickel-rich silicide with traces of vanadium, during the 325° C. and 350° C. heat treatments. Gold layer 96 limits the amount and thickness of the nickel silicide layer formed, since an excessive silicide layer will be brittle and hence unreliable. During the 350° C. heat treatment, the gold in layer 96 partially diffuses into the silicon to form a low resistance metal-semiconductor contact (by limiting the temperature to less than 363° C., formation of a gold/silicon eutectic is avoided, although such a eutectic may be desirable in certain applications). The result is a reaction layer 97 (FIG. 7B) between nickel-vanadium layer 98 and chip 38, gold layer 96 no longer existing as an independent entity. Reaction layer 97 is a combination of the nickel-silicide reaction, limited by the gold layer, and the gold-silicon diffusion reaction, limited by the already formed thin nickel silicide layer.

The 6,000 Angstrom nickel-vanadium layer 98 acts as a barrier layer to prevent silicon diffusion to the top layer 100 of gold, where it would form an undesirable silicon oxide layer. During heat treatment a portion of nickel-vanadium layer 98 diffuses into gold layer 100 to convert gold layer 100 into an alloy layer 100 of gold and nickel with traces of vanadium.

After heat treatment, a very thin nickel oxide layer forms on top of alloy layer 100. This layer is removed chemically by dipping in an oxalic acid bath, or removed atomically by radio frequency argon ion sputter etching. A final two layers 104 and 106 are then deposited on chip 38, typically by radio frequency sputter etch in system 82. Without breaking vacuum, which may cause further nickel oxide growth, the chip 38 is passed under metal cathodes 92, 93 which deposit an 800 Angstrom intermediate layer of nickel—7 wt. % vanadium 104 and a 3,000 Angstrom layer of gold 106 in series. The chip now has the configuration shown in FIG. 7B and is ready to be soldered to the lower plate 36 of heat sink 20.

A preformed sheet 40 of solder, preferably lead/indium in equal parts by weight, is used to attach chip 38 to the lower plate 36 of heat sink 20. The lead/indium solder has a melting/freezing point of about 170° C., and is quite soft. In the soldering operation, which occurs under vacuum, chip 38 as well as the other elements present are heated, and the nickel and gold layers 104, 106 proximate the solder are leached into the solder. Gold layer 106 provides an initial oxideless wetable surface for the molten solder to minimize and effectively eliminate the trapping of gas, assisted by the fact that the operation is performed under vacuum. The lack of trapped gas eliminates voids in the solder between chip 38 and plate 36 which would cause "hot spots" where the heat sink cooling would be ineffective and the chip could be damaged.

The final configuration of the chip 38 and lower plate 36 includes intervening layer 98 of nickel-vanadium, a portion of which 97 is a nickel-rich silicide and a diffusion of gold and silicon, fused to chip 38. Alloy layer 100 and solder layer 40, which includes the leached gold and nickel-vanadium from former layers 106 and 104, overlie nickel-vanadium layer 98, the solder layer attaching chip 38 and its metallized layers to lower plate 36.

4. Chip/Ceramic Connections

The exposed face of chip 38 is illustrated in FIG. 8A. This exposed face includes a plurality of contacts 108 in a square configuration. The square configuration of contacts 108 is rotated 45° from the square periphery of chip 38. Contacts 108 include the signal contacts for the passage of signals to and from the circuits on the chip, and also power and ground contacts to provide power and ground to the circuits on the chip. As illustrated in FIG. 8B, multilayer ceramic 48 has a corresponding square array of contacts 46, oriented 45° from the periphery of the perimeter of the ceramic. In the preferred embodiment there is an exact correspondence between contacts 46 on ceramic 48 and contacts 108 on chip 38, the respective arrays of contacts being mirror images of one another, although in practice the power and ground contacts on the ceramic may not be utilized. As is known in the art, ceramic 48 includes internal electrical vias or traces joining the various leads 46 with external pins 18 (see FIG. 2).

The relationship of semiconductor chip 38, multilayer ceramic 48, and the intervening elements, is illustrated in FIG. 9. Power bus bar frame 30 and ground bus bar frame 24, separated by insulating bonding layer 32, lie above the frame 49 for ceramic 48. An insulating bonding layer 110 electrically isolates ceramic frame 49 from ground bus bar frame 24. The combination of heat sink 20, frames 30 and 26 and 49, and bonding layers 32 and 110, provide a hermetically sealed chamber in which the chip/ceramic connections are made.

Alternating power bus bars 42 and ground bus bars 44 are supported by power bus bar frame 30 and ground bus bar frame 24 respectively. While discrete bars are preferred, machined or apertured plates could be used also for power and ground respectively. The electrical connections are made through heat sink 20, and for the power bus bars and for the ground bus bars through plates 22, 23. The lower surface of chip 38, and the upper surface of multilayer ceramic 48, are both closely proximate the power and ground bus bars, but a slight spacing is left between each of the faces and the bus bars.

The manner in which signal connections are made between chip 38 and ceramic 48 is illustrated by way of reference to FIGS. 10-13A, B in combination. Each bus bar 42, 44 has layers 111, 112 of silicon rubber molded directly to its upper and lower surfaces respectively. Each layer 111, 112 includes a plurality of bumps 113, 114 molded in the silicone rubber, the bumps being elastic and resilient.

Electrical connections are made to and around the bus bars by means of three types of leads, illustrated individually in FIGS. 14A-C. The leads are formed of highly electrically conductive material, typically copper. FIG. 14A depicts a power lead 116, comprising a flat strip of conductive material such as copper. Lead 116 includes an enlarged central portion 118 and narrow end portions 119, 120, emanating from the left edge of central portion 118 as shown in FIG. 14A. The tips 121, 122 of end portions 119, 120 are rounded.

A ground lead 124 is illustrated in FIG. 14B, and is essentially a mirror-image of the power lead. Ground lead 124 is a flat strip of material, with a wide central portion 126, narrow end portions 127, 128 emanating from the right edge of central portion 126 (as shown in FIG. 14B), and rounded tips 129, 130. Signal conductor 132 is illustrated in FIG. 14C, and comprises a long narrow flat strip of electrically conductive material, such as copper, with rounded ends 133, 134.

Referring specifically to FIG. 13A, each power lead 116 is attached to a power bus bar 42. The large central portion 118 is fixed (welded, soldered etc.) directly to the side of power bus bar 42. Flexible upper end 119 is bent approximately 90° so that the round tip 121 lies flush on top of a resilient bump 113 at the far side of the bus bar. Correspondingly, lower end 120 is also bent 90° so tip 122 lies flush on top of bump 114. Power leads 116 are attached along one side only of each power bus bar 42, and occupy every fourth bump 113 along the top of the bus bar. Since the bumps are arranged in two rows, power leads 116 occupy every other bump along the right row of bumps, as illustrated in FIG. 13A.

Ground leads 124 are attached along one side of each ground bus bar 44. As illustrated in FIG. 11, the enlarged central portion 126 of each ground lead 124 is fixed directly to the side of the ground bus bar, so that the central portion 126 of the ground lead and the central portion 118 of a power lead are juxtaposed back to back. The upper ends 126 of each ground lead are bent 90° so that the round tip 129 is flush upon a bump 113. Lower ends 128 are similarly bent so that the rounded tips 130 are flush on top of bumps 114.

A pair of sheets 136, 137 of electrically insulative material, typically Kapton, are disposed between each adjacent power bus bar 42 and ground bus bar 44. Sheets 136 and 137 overlie the central portions 118, 126 of power leads 116 and ground leads 124, and the central portions of these leads serve to space sheets 136, 137 from the bus bars themselves. On the sides of the bars where there are no power and ground leads, spacers 138 are provided for this purpose.

Signal leads 132 pass between adjacent sheets 136, 137 of insulative material. The central portions of signal leads 132 are straight, and the ends are bent approximately 90° so that the rounded tips 133, 134 are flush on top of bumps 113, 114 respectively. Accordingly, the signal leads are insulated from both power bus bar 44 and ground bus bar 42. In FIG. 11, the signal leads are designated "S", the ground leads "GND", and the power leads "PWR", for convenient reference.

When the module assembly is joined together, the upper ends of each power, ground and signal lead are pressed against and soldered to an adjacent contact 108 on chip 38, as illustrated in FIG. 12. The dimensions are such that each resilient bump 113 is compressed, typically approximately 20%, to provide a biasing force pressing the lead against the contact. Similarly, bumps 114 are compressed to bias the lower ends of the leads against the contacts 46 on ceramic 48, to which the leads are soldered. The ends of the leads are completely flexible, and the bumps are elastic, to accommodate relative movement during differential heat expansion and the like. As a result, extremely reliable soldered connections are made between the numerous contacts on the chip and on the ceramic.

5. Module Operation

Assembled module 10 is cooled by water flowing through heat sink 20. Other cooling fluids could be used as well. The construction of heat sink 20 is such that uniform cooling is provided to all parts of the chip. Chip 38 is soldered directly to the lower plate 36 of heat sink 20 so that the cooling action is efficient, and the heat sink provides an electrical ground to the chip as well.

Electrical connections are made between the chip 38 and multilayer ceramic 48 by means of signal contacts which are isolated from power and ground bus bars 42, 44 between the chip and ceramic. Power and ground leads 118, 126 connect the respective bus bars to the chip. Power leads 118 and ground leads 126 are also connected to the ceramic for convenience of assembly, but the connections between the bus bars and the ceramic need not be functional. Electrical signals are passed to and from the chip by external pins 18, which communicate through multilayer ceramic 48 and the signal leads to chip 38.

While a preferred embodiment of the present invention has been illustrated in detail, it is apparent that modifications and adaptations of that embodiment will occur to those skilled in the art. However, it is to be expressly understood that such modifications and adaptations are within the spirit and scope of the present invention, as set forth in the following claims.

I claim:
1. A semiconductor chip module comprising:
a mounting surface;
a silicon semiconductor chip with electronic circuits formed therein having a back face and contacts on the opposite, front face, said back face being metallized and heat treated to include a nickel-rich silicide reaction layer, a nickel-vanadium barrier layer overlying the reaction layer, and a nickel-gold alloy layer overlying the barrier layer; and
a solder layer securing the metallized back face of the chip to the mounting surface substantially without voids.

2. The module of claim 1 wherein the nickel-vanadium layer contains 7% by weight vanadium.

3. The module of claim 1 wherein the barrier layer is metallized nickel—7 wt. % vanadium.

4. The module of claim 3 wherein said gold layer has a thickness of approximately 3,000 Angstroms.

5. A semiconductor chip module comprising:
a mounting surface;
a silicon semiconductor chip with electronic circuits therein having a back face and contacts on the opposite, front face, said back face being metallized to include a layer of gold and nickel-vanadium reacted with the silicon to form a diffusion of gold and silicon and a nickel-rich silicide, a layer of nickel-vanadium, a layer of gold/nickel-vanadium alloy, and a gold layer; and
a solder layer securing the metallized back face of the chip to the mounting surface the gold layer being leached into the solder during soldering.

6. The module of claim 1 or 5 wherein the mounting surface comprises a heat sink having a cooled mounting surface.

7. the module of claim 6 wherein the heat sink is liquid cooled.

8. The module of claim 6 wherein the heat sink is constructed of molybdenum.

9. The module of claim 1 or 5 wherein the solder is lead/indium in equal parts by weight.

10. The module of claim 1 or 5 wherein the solder has melting/freezing temperature of about 160° C.

11. The module of claim 1 or 5 wherein the semiconductor chip comprises a single, unitary chip having an area of about 3,600 square millimeters.

12. The module according to claim 3 wherein a portion of the reaction layer is formed by reaction of the silicon with the barrier layer.

13. The module according to claim 12 wherein the solder layer has gold disposed therein.

14. The module according to claim 13 wherein the gold is leached from a gold layer disposed between the solder layer and the barrier layer.

15. The module according to claim 14 wherein the solder layer has nickel and vanadium disposed therein.

16. The module according to claim 15 wherein the nickel and vanadium are leached from a nickel-vanadium intermediate layer disposed between the solder layer and the barrier layer.

17. The module according to claim 16 wherein the nickel-vanadium intermediate layer has a thickness of approximately 800 Anstroms.

18. The module according to claim 16 wherein the nickel-vanadium intermediate layer is disposed between the gold layer and the barrier layer, the gold layer forming a wetable surface for the solder layer.

19. The module according to claim 18 wherein the nickel-vanadium intermediate layer is disposed between the gold layer and the nickel-gold alloy layer.

* * * * *